United States Patent
Wang et al.

(10) Patent No.: US 8,039,401 B2
(45) Date of Patent: Oct. 18, 2011

(54) STRUCTURE AND METHOD FOR FORMING HYBRID SUBSTRATE

(75) Inventors: Qi Wang, Sandy, UT (US); Joelle Sharp, Herriman, UT (US); Minhua Li, Sandy, UT (US); Hui Chen, South Jordan, UT (US)

(73) Assignee: Fairchild Semiconductor Corporation, So. Portland, ME (US)

( * ) Notice: Subject to any disclaimer, the term of this patent is extended or adjusted under 35 U.S.C. 154(b) by 168 days.

(21) Appl. No.: 12/332,326

(22) Filed: Dec. 10, 2008

(65) Prior Publication Data
US 2009/0302482 A1    Dec. 10, 2009

Related U.S. Application Data

(60) Provisional application No. 61/013,795, filed on Dec. 14, 2007.

(51) Int. Cl.
*H01L 21/30*    (2006.01)
*H01L 21/46*    (2006.01)
*H01L 21/20*    (2006.01)
*H01L 21/36*    (2006.01)
*H01L 21/311*  (2006.01)

(52) U.S. Cl. ........ 438/700; 438/694; 438/455; 438/478; 257/E21.088; 257/E21.567; 257/E21.214; 257/E21.599

(58) Field of Classification Search .......... 438/455, 438/478, 694, 700; 257/E21.088, E21.567, 257/E21.214, E21.599
See application file for complete search history.

(56) References Cited

U.S. PATENT DOCUMENTS

| | | | |
|---|---|---|---|
| 6,555,891 | B1 | 4/2003 | Furukawa et al. |
| 7,023,055 | B2 | 4/2006 | Ieong et al. |
| 7,208,815 | B2 | 4/2007 | Chen et al. |
| 7,235,433 | B2 | 6/2007 | Waite et al. |
| 7,253,034 | B2 | 8/2007 | Chan et al. |
| 7,435,639 | B2 | 10/2008 | Winstead et al. |
| 2004/0256700 | A1 * | 12/2004 | Doris et al. ............... 257/627 |
| 2005/0093104 | A1 * | 5/2005 | Ieong et al. ............... 257/627 |
| 2005/0167742 | A1 | 8/2005 | Challa et al. |
| 2007/0281436 | A1 | 12/2007 | Sadaka et al. |

OTHER PUBLICATIONS

U.S. Appl. No. 12/174,030, filed Jul. 16, 2008, Qi Wang et al.
PCT International Search Report of the International Searching Authority for Application No. PCT/US2008/86661, Mailed Feb. 4, 2009.
PCT Written Opinion of the International Searching Authority for Application No. PCT/US2008/86661, Mailed Feb. 4, 2009.

* cited by examiner

*Primary Examiner* — Alexander Ghyka
*Assistant Examiner* — Seahvosh Nikmanesh
(74) *Attorney, Agent, or Firm* — Kilpatrick Townsend & Stockton LLP

(57) ABSTRACT

A first and a second substrate are bonded together to thereby form a unitary hybrid substrate. Predefined portions of the first substrate are removed to form openings in the first substrate through which surface regions of the second substrate are exposed. A selective epitaxial growth process that is selective with respect to the crystalline orientations of the first and second substrates is carried out to thereby form epitaxial silicon from the exposed surfaces of the second substrate but not from exposed surfaces of the first substrate. The epitaxial silicon formed from the exposed surfaces of the second substrate has the same crystalline orientation as the second substrate.

18 Claims, 14 Drawing Sheets

STRUCTURE AND METHOD FOR FORMING HYBRID SUBSTRATE

CROSS-REFERENCES TO RELATED APPLICATIONS

This application claims the benefit of U.S. Provisional Application No. 61/013,795, filed Dec. 14, 2007, which is incorporated herein by reference in its entirety for all purposes.

BACKGROUND OF THE INVENTION

The present invention relates in general to semiconductor technology, and more particularly to semiconductor hybrid substrates and methods for forming the same.

Typically, both n-type and p-type transistors are formed on a wafer having a particular crystalline orientation. N-type transistors have an electron mobility in the [100] crystalline orientation higher than in the [110] crystalline orientation. Whereas, p-type transistors have a hole mobility in the [110] crystalline orientation higher than in the [100] crystalline orientation. Accordingly, hybrid structures having (100) regions and (110) regions are provided to accommodate n-type transistors and p-type transistors on the same substrate, respectively. However, the known techniques for forming such hybrid structures require complex process technologies with tight process windows, and thus are not cost effective. Further, these techniques often suffer from defect related issues.

Thus, there is a need for hybrid structures with superior characteristics and cost effective techniques for forming the same.

BRIEF SUMMARY OF THE INVENTION

In accordance with an embodiment of the invention, a method for forming a hybrid substrate includes providing first and second substrates having different crystalline orientations. The first and second substrates are bonded together to thereby form a unitary hybrid substrate. Predefined portions of the first substrate are removed to form openings in the first substrate through which surface regions of the second substrate are exposed. A selective epitaxial growth process that is selective with respect to the crystalline orientations of the first and second substrates is carried out to thereby form epitaxial silicon from the exposed surfaces of the second substrate but not from exposed surfaces of the first substrate. The epitaxial silicon formed from the exposed surfaces of the second substrate has the same crystalline orientation as the second substrate.

In one embodiment, prior to the bonding step, a hydrogen-rich region is formed at a predetermined depth within the first substrate. After the bonding step, a cleaving process is performed to separate the first substrate into two portions along the hydrogen-rich region.

In another embodiment, prior to the removing step, the first substrate is thinned down to a desired thickness.

In another embodiment, first and second transistors are formed in the epitaxial silicon and the second substrate, respectively. The first transistor is capable of operating based on hole current conduction, and the second transistor is capable of operating based on electron current conductions.

In another embodiment, a silicon removal process is carried out so that a top surface of the second substrate and a top surface of the epitaxial silicon become substantially coplanar.

In another embodiment, the grown epitaxial silicon directly contacts sidewalls of the openings in the first substrate.

In another embodiment, prior to forming the epitaxial silicon, dielectric spacers are formed along sidewalls of the openings in the first substrate so that after the epitaxial silicon is formed, the dielectric spacers insulate the epitaxial silicon from the first substrate.

In accordance with another embodiment of the invention, a method for forming a hybrid substrate includes bonding together first and second substrates with a dielectric layer extending therebetween to thereby form a unitary hybrid substrate. The first and second substrates have different crystalline orientations. Predefined portions of the first substrate and the dielectric layer are removed to form openings extending in the first substrate and in the dielectric layer such that surface regions of the second substrate become exposed through the openings. A selective epitaxial growth process that is selective with respect to the crystalline orientations of the first and second substrates is carried out to thereby form epitaxial silicon from the exposed surfaces of the second substrate but not from exposed surfaces of the first substrate. The epitaxial silicon formed from the exposed surfaces of the second substrate has the same crystalline orientation as the second substrate.

In one embodiment, a first substrate having a first dielectric layer extending over a surface of the first substrate is provided, and a second substrate having a second dielectric layer extending over a surface of the second substrate is provide. The first and second dielectric layers together form the dielectric layer.

In another embodiment, prior to the bonding step, a hydrogen-rich region is formed at a predetermined depth within the first substrate. After the bonding step, a cleaving process is performed to separate the first substrate into two portions along the hydrogen-rich region.

In another embodiment, prior to the removing step, the first substrate is thinned down to a desired thickness.

In another embodiment, the grown epitaxial silicon directly contacts sidewalls of the openings in the first substrate.

In another embodiment, prior to forming the epitaxial silicon, dielectric spacers are formed along sidewalls of the openings in the first substrate and the first and second dielectric layers so that after the epitaxial silicon is formed, the dielectric spacers insulate the epitaxial silicon from the first substrate.

In accordance with yet another embodiment of the invention, a hybrid substrate includes first and second semiconductor substrates that are bonded together. The first and second semiconductor substrates have different crystalline orientations. The first substrate has openings that extend through it. The hybrid substrate further includes epitaxial silicon that substantially fills the openings in the first substrate. The epitaxial silicon has the same crystalline orientation as the second substrate, and is in direct contact with the first substrate along sidewalls of the openings.

In another embodiment, the hybrid substrate further includes first and second transistors in the epitaxial silicon and the second substrate, respectively. The first transistor is capable of operating based on hole current conduction, and the second transistor is capable of operating based on electron current conductions.

In another embodiment, a dielectric layer insulates the first and second substrates from one another.

In yet another embodiment, the first and second substrates are in direct contact with one another.

In still another embodiment, the silicon region is in direct contact with the second substrate.

BRIEF DESCRIPTION OF THE DRAWINGS

A further understanding of the nature and advantages of the present invention may be realized by reference to the remaining portions of the specification and the drawings wherein like reference numerals are used throughout the drawings to refer to similar components.

DETAILED DESCRIPTION OF THE INVENTION

According to embodiments if the invention, techniques directed to semiconductor integrated circuits and methods of manufacturing the same are disclosed. More particularly, techniques directed to forming hybrid substrates using orientation-dependent selective epitaxial growth are described. In one particular embodiment, first and second substrates having different crystalline orientations are bonded together. Openings are then formed in the first substrate such that surface regions of the second substrate become exposed through the openings. A selective epitaxial growth process that is selective with respect to the crystalline orientations of the two substrates is then used to form epitaxial silicon from the surfaces of the second substrate that are exposed through the openings, but not from any exposed surfaces of the first substrate. In this manner a high quality epitaxial silicon that has the same crystalline orientation as the substrate from which it is grown is formed adjacent to a silicon region with a different crystalline orientation.

The techniques according to embodiments of the invention, eliminate the defect problems associated with the dielectric-assistant selective epitaxial growth process of prior art techniques. Furthermore, the epitaxial growth, according to embodiments of the invention, can be carried out with a much larger process window (e.g., wide temperature window) than prior art techniques, which helps ensure growth of high quality epitaxial silicon. Also, in conventional hybrid substrates, two different materials (dielectric and silicon) are typically present along the top surface, thus requiring use of chemical mechanical polish to obtain planar top surface. In contrast, because the techniques according to the invention do not require use of dielectric material in forming the hybrid substrate, the top surface of the hybrid substrate can be free of dielectric material thus allowing use of the simpler and far less costly wafer polishing processes. Therefore, the techniques according to embodiments of the invention provide high quality, defect free hybrid substrates using simple and highly cost-effective manufacturing processes. These and other features and advantages of the various embodiments of the invention will become more apparent from the detailed description of these embodiments set forth next.

Figure 1A:
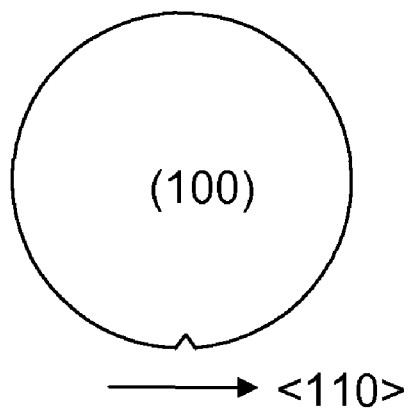
FIGS. 1A-1D are drawings showing wafers having various crystalline.
Figure 1B:
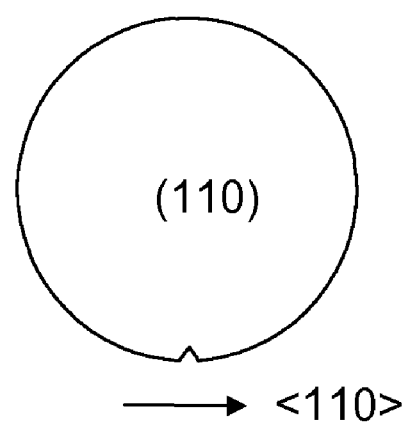
Figure 1C:
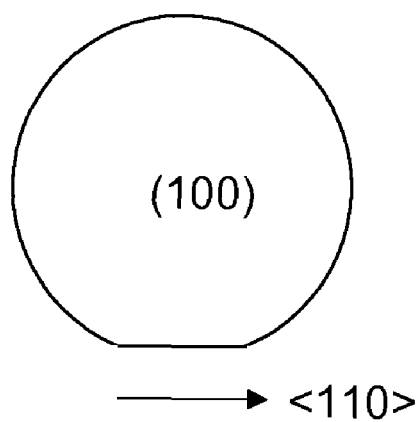
Figure 1D:
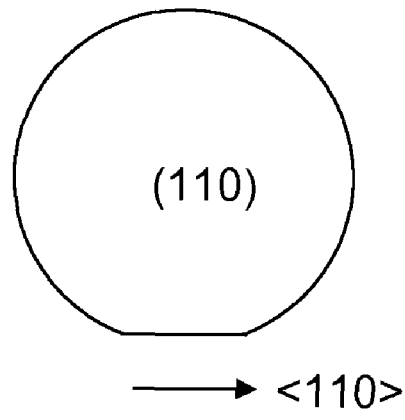

FIGS. 1A-1D are drawings showing wafers having various crystalline orientations. In FIGS. 1A and 1B, the wafers have notches at the bottom. In FIGS. 1C and 1D, the wafers have flat edges at the bottom. The wafers shown in FIGS. 1A and 1C are (100) wafers which have a crystalline orientation [100] normal to the surfaces of the wafers. The wafers shown in FIGS. 1B and 1D are (110) wafers which have a crystalline orientation [110] normal to the surfaces of the wafers. All of the wafers shown in FIGS. 1A-1D have crystalline orientation [110] in the horizontal (or lateral) directions.

Figure 2A:
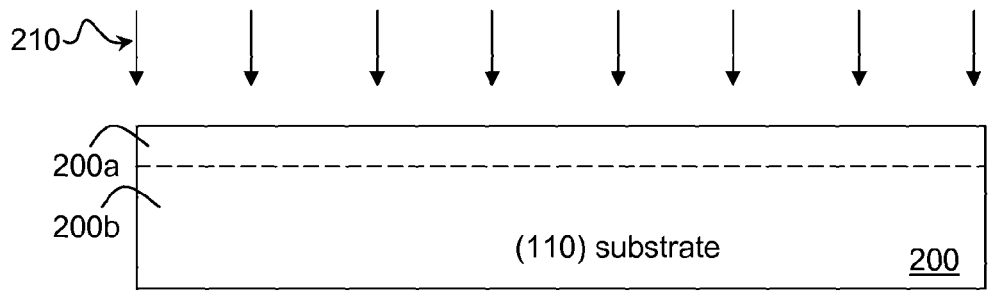
FIGS. 2A-2F are simplified cross-sectional views showing an exemplary process for forming a hybrid substrate according to an embodiment of the present invention.

FIGS. 2A-2F are simplified cross-sectional views of an exemplary process for forming a hybrid substrate according to an embodiment of the present invention. In FIG. 2A, (110) substrate 200 (e.g., similar to the wafers shown in FIGS. 1B and 1D) is subjected to hydrogen-containing implant 210. Substrate 200 may be a silicon substrate, a III-V compound substrate, a silicon/germanium (SiGe) substrate, a silicon carbide substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example.

Hydrogen-containing implant 210 may implant hydrogen ions and/or molecules into substrate 200. Hydrogen-containing implant 210 forms a hydrogen-rich region at a predetermined depth (depicted by the dashed line in FIG. 2A) within substrate 200, thus dividing substrate 200 into upper portion 200a and lower portion 200b. In some embodiments, hydrogen-containing implant 210 may have a dose of about $3 \times 10^{16}$ cm$^{-2}$ and energy between about 60 keV and about 170 keV.

In some embodiments, the concentration of hydrogen ions is provided at a desired depth and energy potential to form the hydrogen-rich region having an exemplary thickness between about 1 μm and about 2 μm. Because of hydrogen embrittlement, the bonding of the hydrogen-rich region lattice is weaker than that of non-hydrogen doped silicon lattice.

Figure 2B:
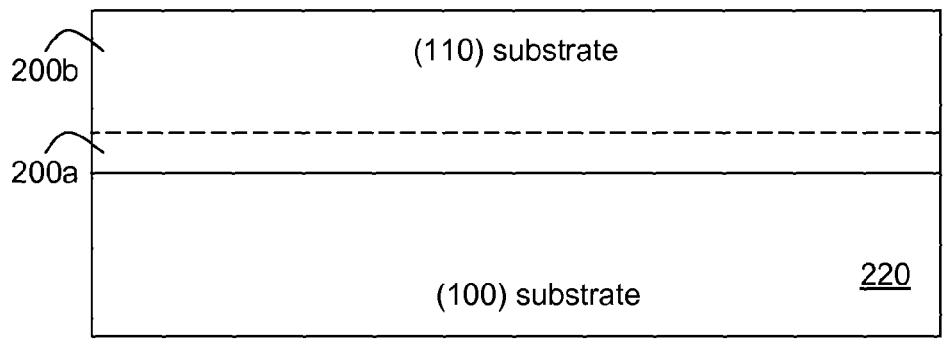

In FIG. 2B, (110) substrate 200 is flipped and bonded to (100) substrate 220. Substrate 220 may be a wafer similar to the wafers shown in FIGS. 1A and 1C. In some embodiments, the bonding can be carried out by using any of a number of known bonding techniques. For example, after a wet chemical and de-ionized (DI) water treatment to render the surfaces of substrates 200 and 220 hydrophilic, substrates 200 and 220 may be bonded at room temperature.

Figure 2C:
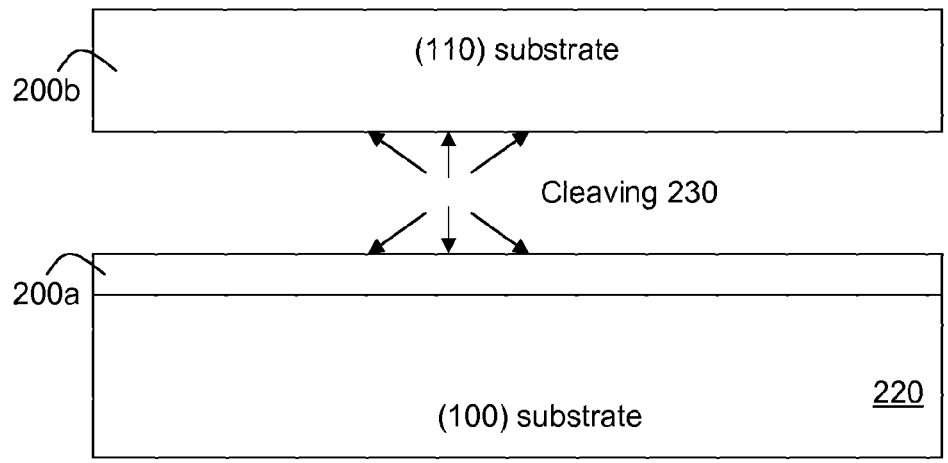

In FIG. 2C, a conventional cleaving process 230 is carried out to cleave substrate 200 along the hydrogen-rich region to thereby separate substrate portions 200a and 200b from each other. Substrate portion 200a thus remains over the (100) substrate 220. In some embodiments, cleaving process 230 may include annealing the bonded substrates at a temperature between about 200° C. and about 300° C. for about 5 hours to about 10 hours. In other embodiments, cleaving process 230 may include annealing the bonded substrates at a temperature of about 450° C. for about 15 minutes. In still other embodiments, the bonded substrates are subjected to a two-level annealing process. In the first level, the bonded substrates are subjected to an anneal process at a temperature between about 250° C. and about 300° C. for about 5 hours to about 10 hours. In the second level, the bonded substrates are subjected to an anneal process at a temperature of about 450° C. for about 45 minutes.

Upon completion of cleaving process 230, substrate portion 200a is transferred from the (110) substrate 200 to (100) substrate 220, and thus two substrates having different crystalline orientations are bonded together.

Figure 2D:
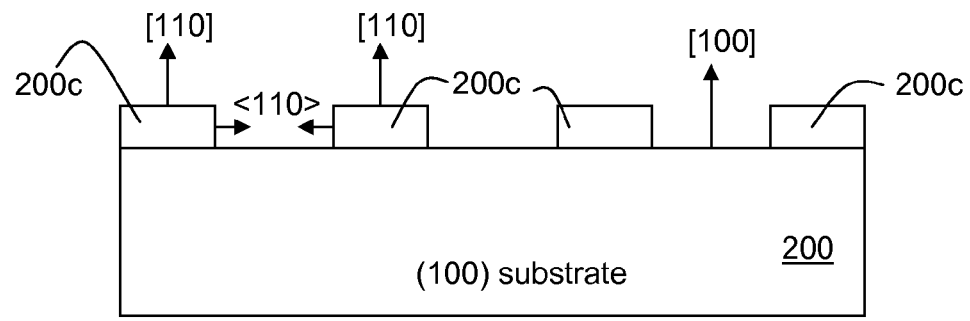

In FIG. 2D, predefined portions of the (110) substrate 200a are removed to thereby expose surface regions of substrate 220. Of substrate 200a, islands regions 200c thus remain. Island regions 200c may be formed by, for example, forming a patterned photoresist layer (not shown) over substrate 200a followed by a conventional etch process to remove portions of substrate 200a exposed through the patterned photoresist layer. After forming island regions 200c, the patterned photoresist mask may be removed.

As shown in FIG. 2D, a top surface of each of the (110) island regions 200c has a crystalline orientation [110], and sidewalls of each of islands 200c have a crystalline orientation <110> such as [101] or [011]. The exposed surface of substrate 220 has a crystalline orientation [100].

Figure 2E:
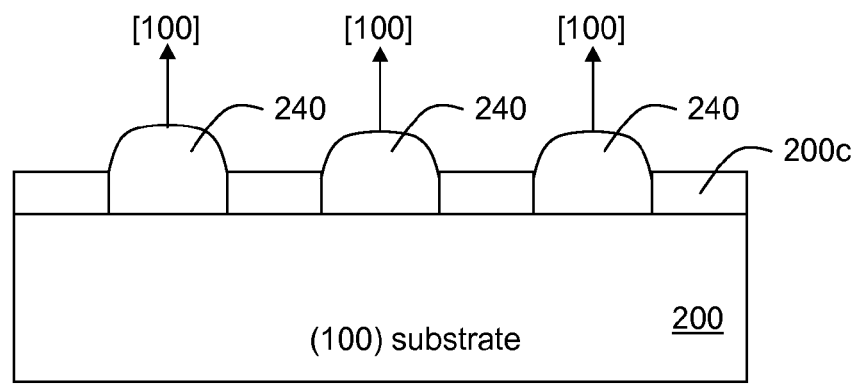

In FIG. 2E, epitaxial regions 240 are selectively formed from those surfaces of the (100) substrate 220 that are exposed through island regions. Because epitaxial regions 240 are selectively formed from exposed surfaces of the (100) substrate 220, they have the crystalline orientation [100]. By using a selective epi growth process, epitaxial silicon is grown only from surfaces with crystalline orientation [100], and thus no epi silicon is formed over surfaces having a different crystalline orientation. In this manner, two silicon regions of different crystalline orientation (i.e., epitaxial regions 240 and island regions 200c) are advantageously formed side-by-side. Note that the crystalline orientation along sidewalls of epitaxial regions 240 advantageously matches that along sidewalls of island regions 200c. This process advantageously eliminates the need for forming dielectric layers over the lateral surfaces or along vertical walls of the island regions to prevent formation of epitaxial silicon from these surfaces. Epitaxial regions 240 may comprise, for example, silicon, silicon-germanium, III-V compounds or various combinations thereof.

Figure 6A:
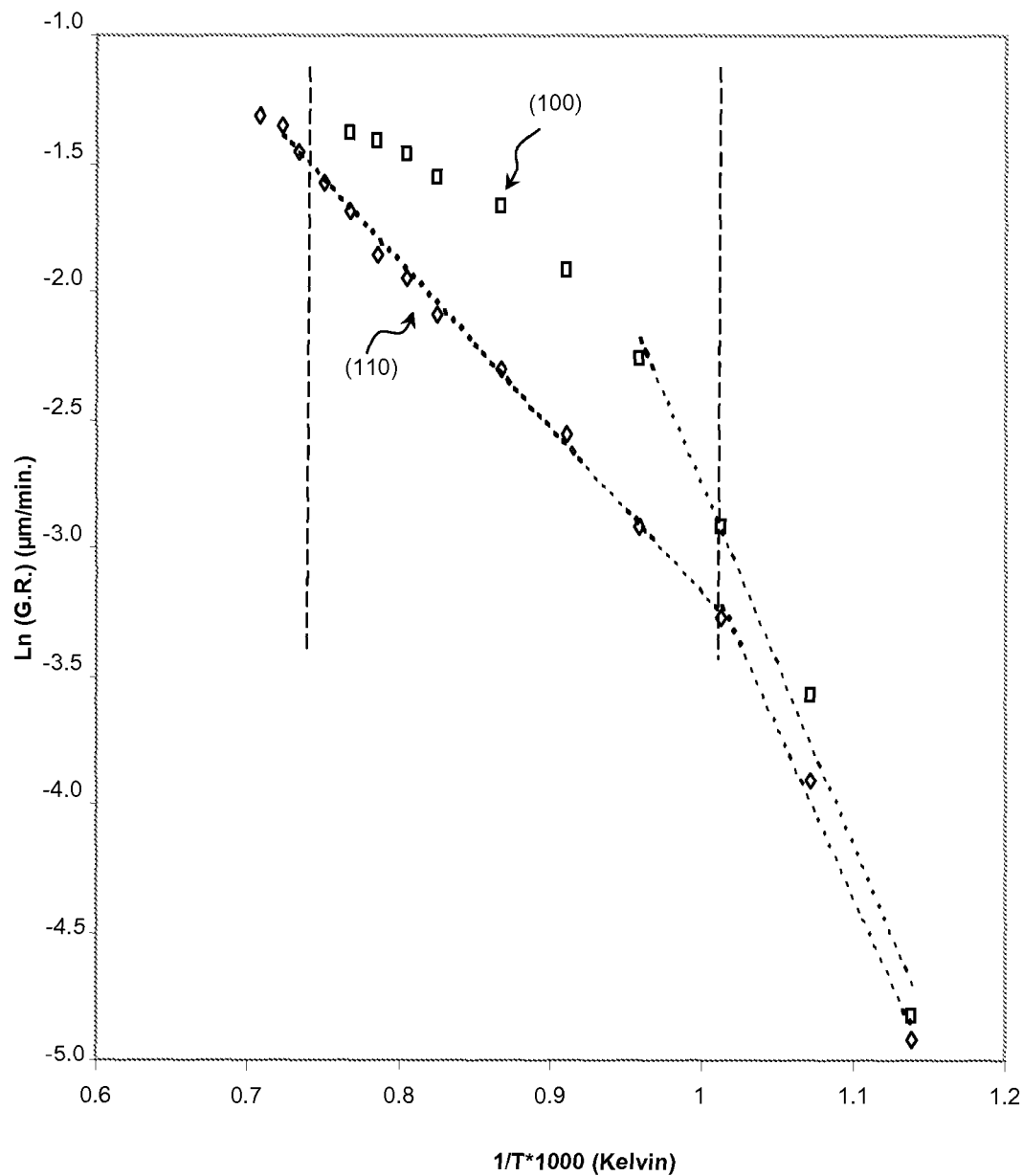
FIG. 6A is a graph showing the relationship between process temperature and epitaxial growth rate difference along surfaces with crystalline orientations [100] versus along surfaces with crystalline orientations [110] when $SiH_2Cl_2$ is used as a precursor.

The process for forming epitaxial regions 240 may use a silicon-precursor such as silane ($SiH_4$), dichlorosilane ($SiH_2Cl_2$), tricholorosilane ($SiHCl_3$), silicontetrachloride ($SiCl_4$) or various combinations thereof. It has been observed that using dichlorosilane at the proper temperature can provide a substantial growth rate difference along surfaces with the crystalline orientation [100] versus along surfaces with the crystalline orientation [110]. This is more clearly shown in the FIG. 6A graph. The FIG. 6A graph shows the relationship between process temperature and the epitaxial growth rate difference along surfaces with crystalline orientations [100] versus along surfaces with crystalline orientation [110] when $SiH_2Cl_2$ is used as a precursor according. As can be seen, at temperatures in the range between about 820° C. (marked in FIG. 6A by the right vertical dashed line maker) and about 1,060° C. (marked in FIG. 6A by the left vertical dashed line maker), a far faster growth rate is obtained along surfaces with crystalline orientations [100] than along surfaces with crystalline orientation [110]. This wide temperature range advantageously provides flexibility in designing the epi growth process thus enabling forming high quality (100) epitaxial regions 240.

Figure 6B:
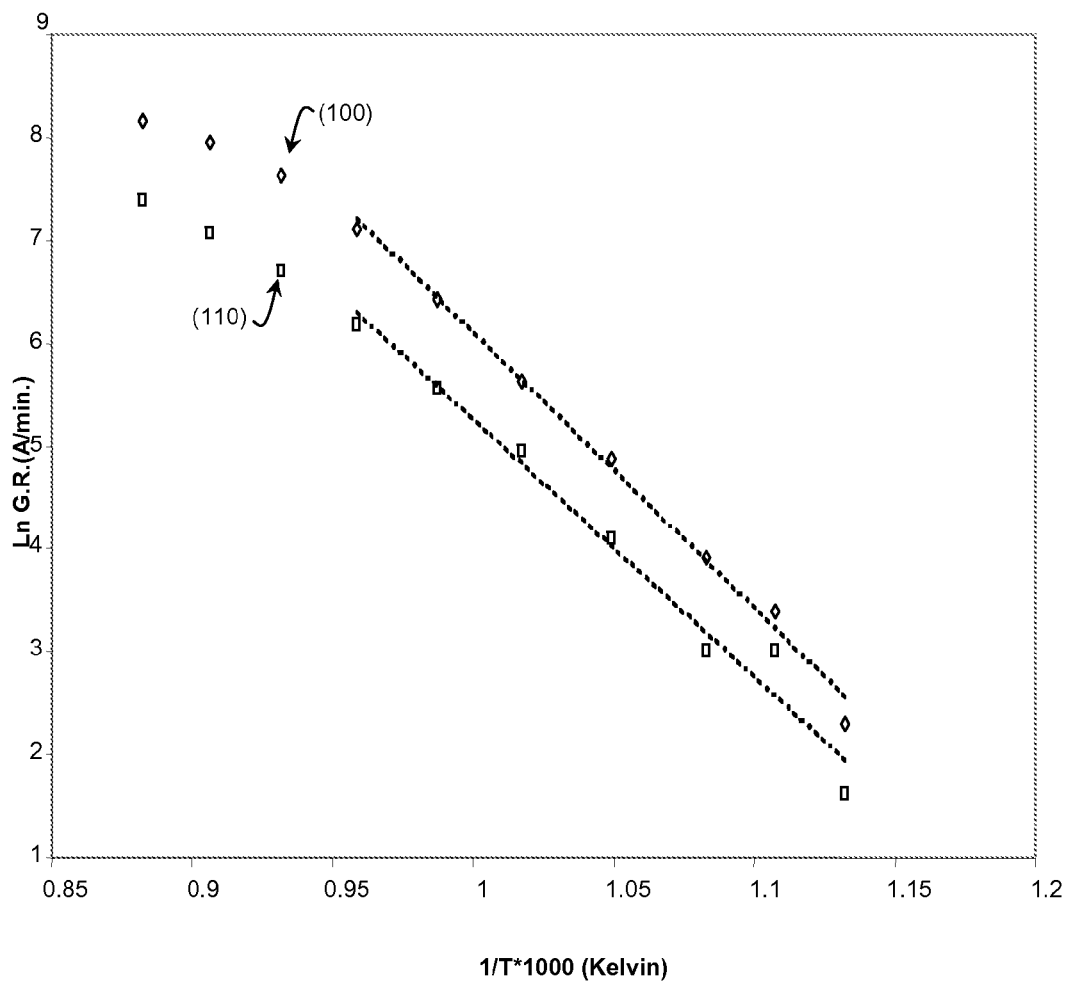
FIG. 6B is a graph showing the relationship between process temperature and the epitaxial growth rate difference along surfaces with crystalline orientations [100] versus along surfaces with crystalline orientation [110] when silane is used as a precursor.

It has also been observed that using silane provides an even wider process window for forming epitaxial regions 240 as shown in FIG. 6B. FIG. 6B is a graph showing the relationship between process temperature and the epitaxial growth rate difference along surfaces with crystalline orientations [100] versus along surfaces with crystalline orientation [110] when silane is used as a precursor. As depicted by the graph in FIG. 6B, through out the temperatures range of about 700° C. to about 1,000° C. (and possibly even a wider range), a faster growth rate is obtained along surfaces with crystalline orientations [100] than along surfaces with crystalline orientation [110]. This even wider temperature range than the embodiment where $SiH_2Cl_2$ is used provides even greater flexibility in designing the epi growth process, thus enabling forming high quality (100) epitaxial regions 240. Furthermore, because the high growth rate differential is attainable at as low a temperature as 700° C. (if not even lower), the epi process advantageously utilizes a smaller amount of the available thermal budget.

Figure 6C:
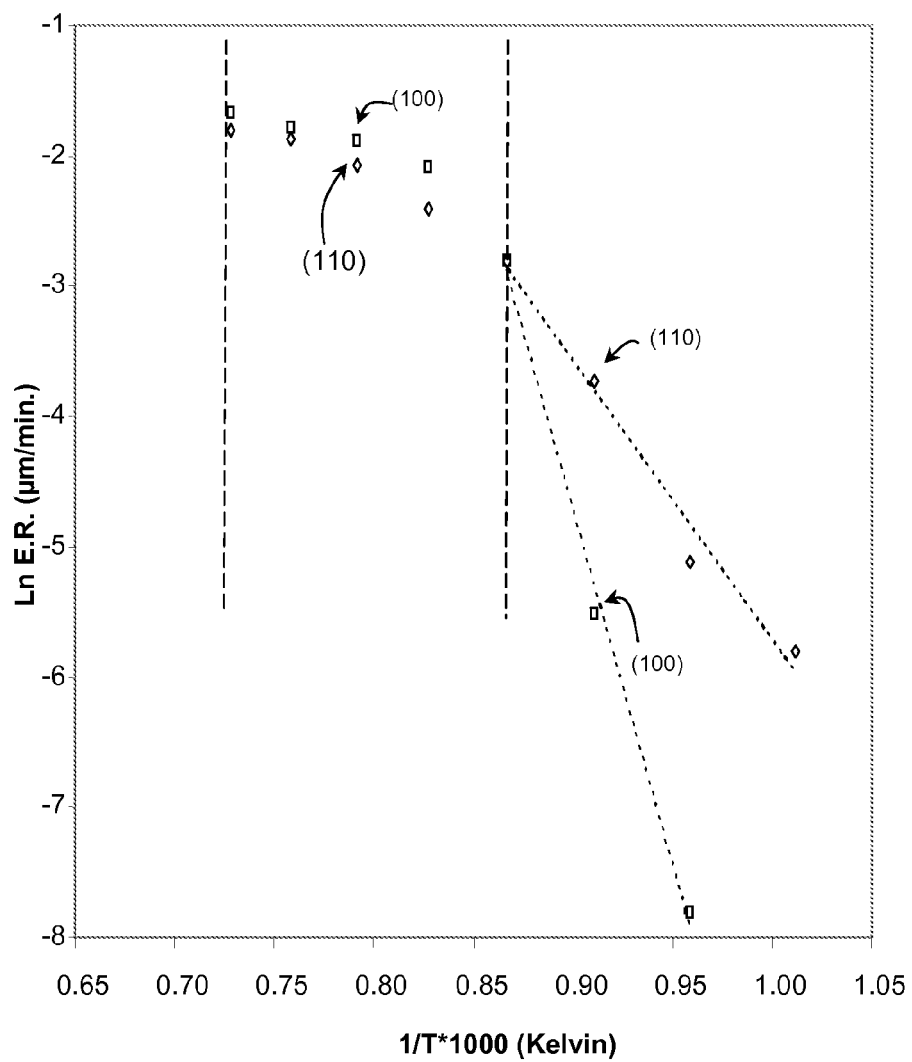
FIG. 6C is a graph showing the relationship between process temperature and the etch rate of epi formed along surfaces with crystalline orientations [100] versus the etch rate of epi formed along surfaces with crystalline orientation [110] where the etchant includes HCL.

In one embodiment, to ensure that no epitaxial region remains over surfaces with crystalline orientation [110] at the end of the epi growth process, a chlorine-containing etchant, such as hydrogen chloride (HCl), is used in the epi growth process. It has been observed that by carefully selecting the temperature for an etch process which uses a chlorine-containing etchant, an etch rate of epi formed along surfaces with crystalline orientations [110] that is the same or greater than the etch rate of epi formed along surfaces with crystalline orientation [100] can be obtained. FIG. 6C is a graph showing the relationship between process temperature and the etch rate of epi formed along surfaces with crystalline orientations [100] versus the etch rate of epi formed along surfaces with crystalline orientation [110] when the etchant includes HCL. As can be seen, at temperatures in the range between about 700° C. and about 1,060° C., the etch rate of epi formed along surfaces with crystalline orientations [110] is the same or greater than the etch rate of epi formed along surfaces with crystalline orientation [100]. The two vertically extending dashed line markers in FIG. 6C show the temperature range wherein the etch rates of epi formed along surfaces with crystalline orientations [110] and epi formed along surfaces with crystalline orientation [100] are substantially the same. However, it may be more desirable to select a temperature at which epi formed along surfaces with crystalline orientations [110] is etched at a faster rate than epi formed along surfaces with crystalline orientation [100].

In one embodiment where dichlorosilane or silane and HCL are used in the epitaxial process, a ratio of dichlorosilane or silane to HCL in the range of 1:2 to 1:8 results in formation of epitaxial regions 240 while no epi remains over (110) island regions 200c upon completion of the epi growth process.

In one specific embodiment, the selective epi growth process for forming epitaxial regions 240 may have a process temperature of about 1,000° C.; a flow rate of dichlorosilane of about 0.15 standard liter per minute (slm); a flow rate of hydrogen chloride of about 0.8 slm; a flow rate of hydrogen of about 30 slm; and a pressure of about 10 torr.

While some specific temperature ranges or values, ratios and materials are set forth above, it is to be understood, that the invention is not limited to these numerical values and ranges or types of material. Other processes whereby an epitaxial layer is selectively grown over surfaces having crystalline orientation [100] while substantially no epitaxial layer is formed over surfaces having crystalline orientation [110] may also be used. Accordingly, selective epitaxial growth on the [100] surface is achieved without the need for dielectric layers protecting the [110] surfaces.

Figure 2F:
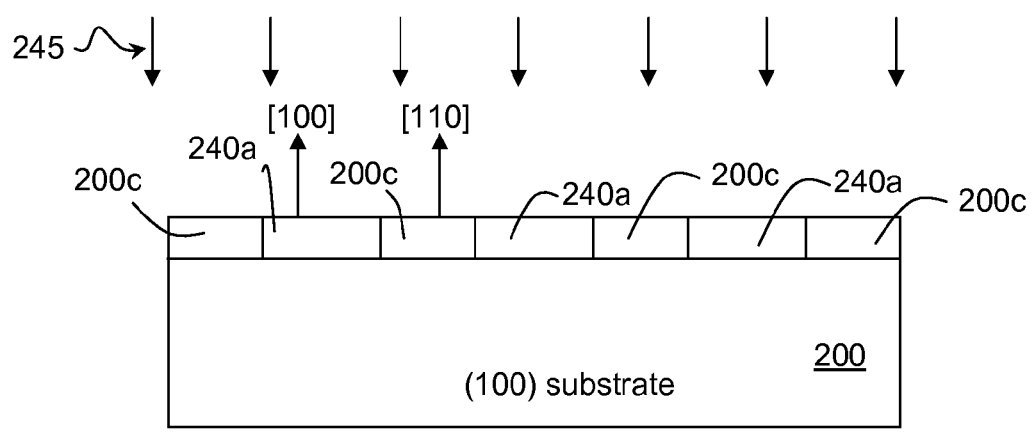

Referring back to the process depicted by FIGS. 2A-2F, in FIG. 2F, a removing process 245 removes portions of epitaxial regions 240 so that island regions 200c and remaining portions 240a of epitaxial regions 240 are substantially coplanar. In other embodiments, top surface of epitaxial regions 240a may be slightly offset relative to that of island regions 200c. Removing process 245 may be an etch-back process and/or a chemical mechanical planarization (CMP) process. In some embodiments, removing process 245 may result in removal of a portion of island regions 200c.

The structure shown in FIG. 2F advantageously includes (110) island regions 200c and (100) epitaxial regions 240a arranged side-by-side. Accordingly, a hybrid substrate having regions with different crystalline orientations [100] and [110] is formed. Various diodes, transistors, devices and/or circuits may be formed in island regions 200c and epitaxial regions 240a. For example, P-channel MOSFETs may be formed within the (110) island regions 200c to take advantage of the high hole mobility of the crystalline orientation [110], and N-channel MOSFETs may be formed in the (100) epitaxial regions 240a to take advantage of the high electron mobility of the crystalline orientation (100). This is achieved without use of protective dielectric layers or spacers commonly required in prior art techniques. Furthermore, the techniques described above avoid the defect-related issues commonly present in process techniques where silicon material of different crystalline orientation are brought in contact with one another. Moreover, the processes described above provide a wide process window thus allowing obtaining high quality substrate material using simple and cost-effective technology.

Figure 2G:
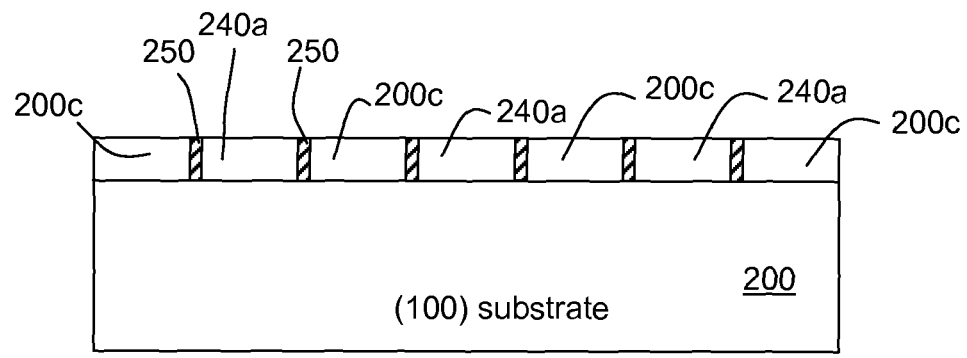
FIG. 2G is a schematic cross-sectional view of an exemplary hybrid substrate having isolation structures therein according to another embodiment of the present invention.

In some ICs, it may be desirable to isolate island (110) regions 200c and (100) epitaxial regions 240a from one another. FIG. 2G is a schematic cross-sectional view showing an exemplary hybrid substrate having isolation regions 250 therein for this very purpose. In FIG. 2G, isolation regions 250 are formed between the (110) regions 200c and (100) epitaxial regions 240a. The isolation regions may comprise oxide, nitride, oxynitride, other dielectric material or various combinations thereof. In one embodiment, isolation regions 250 are formed after forming island regions 200c in FIG. 2D and before forming epitaxial regions 240 in FIG. 2E. The isolation structures 250 may be formed by, for example, a CVD process or using other known processes for forming dielectric spacers.

Figure 3A:
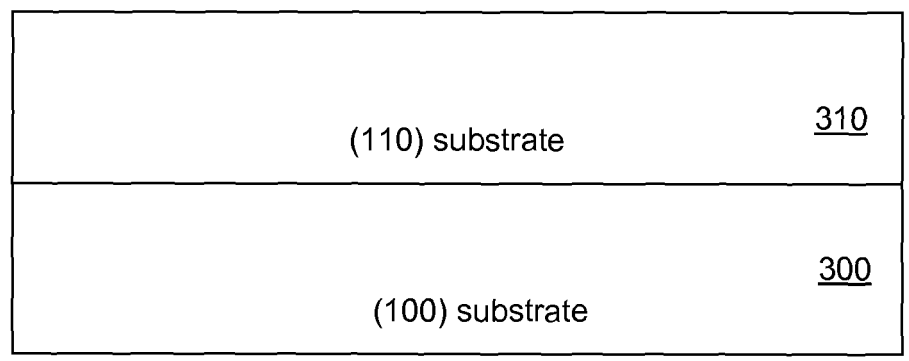
FIGS. 3A-3E are simplified cross-sectional views showing an exemplary process for forming a hybrid substrate according to another embodiment of the present invention.

FIGS. 3A-3E are simplified cross-sectional views showing another exemplary process for forming a hybrid substrate according to an embodiment of the present invention. In FIG. 3A, (110) substrate 310 is bonded over (100) substrate 300. The bonding can be carried out by using any of a number of known bonding techniques. In some embodiments, after a wet chemical and de-ionized (DI) water treatment to render the surfaces of substrates 300 and 310 hydrophilic, the (110) substrate 310 and the (100) substrate 300 may be bonded at room temperature.

Figure 3B:
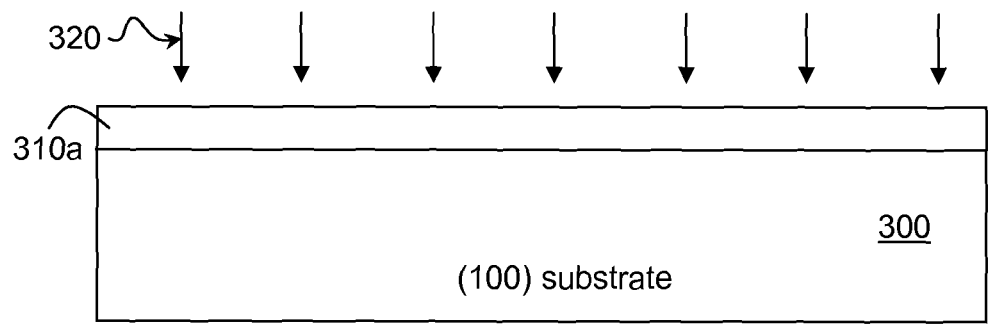

In FIG. 3B, a silicon thinning process 320 may be sued to remove a portion of the (110) substrate 310 such that a layer 310a of the (110) substrate 310 remains over the (100) substrate 300. Silicon thinning process 320 may include, for example, silicon grinding process, CMP process and/or an etch-back process. The silicon process can be designed so that layer 310a has the desired thickness for forming therein circuit components such as diodes and transistors.

Figure 3C:
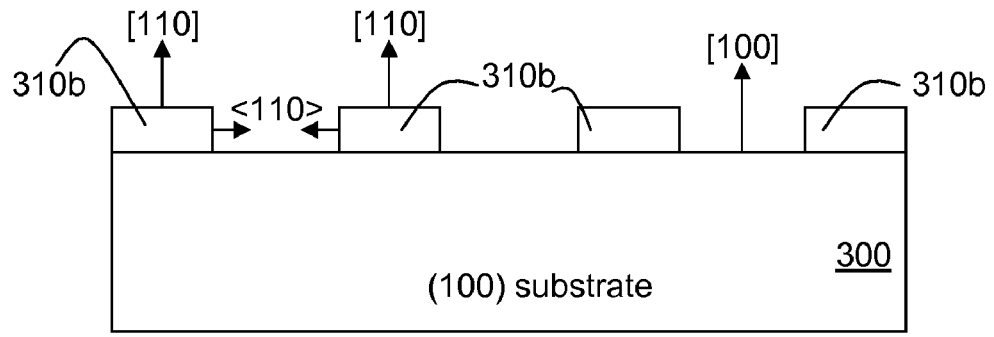
Figure 3D:
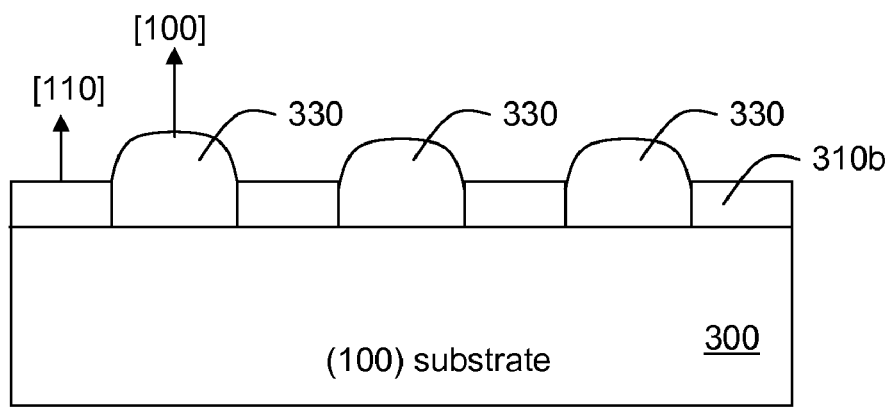

In FIG. 3C, (110) layer 310a is patterned and etched to form island regions 310b. In some embodiments, the process for forming island regions 310b may be similar to that for forming island regions 200c described above in reference to FIG. 2D. In FIG. 3D, epitaxial regions 330 are selectively grown over the exposed (100) surfaces of substrate 300 in a similar manner to epitaxial regions 240 described above in reference to FIG. 2E.

Figure 3E:
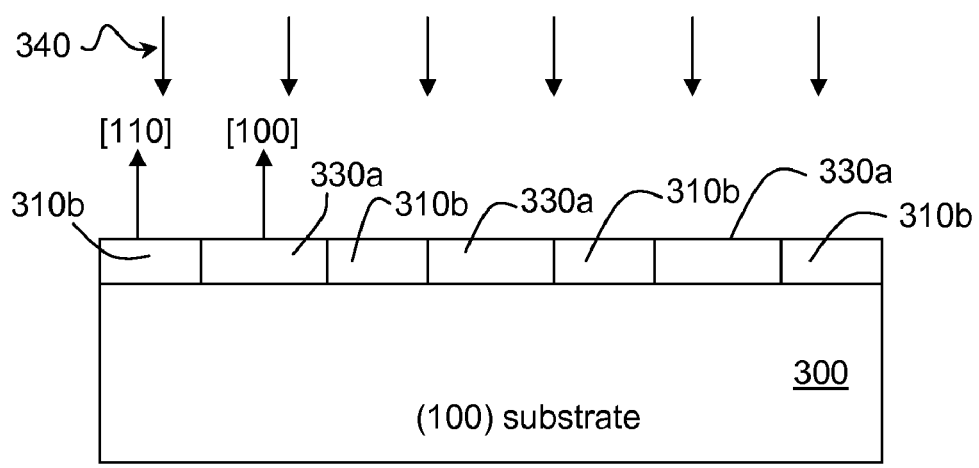

In FIG. 3E, a removing process 340 may be used to remove portions of epitaxial regions 330 so that epitaxial regions 330 and island regions 310b are substantially coplanar. Removing process 340 may be similar to process 245 described above in reference to FIG. 2F. In an alternate embodiment, isolation regions (not shown) similar to isolation regions 250 shown in FIG. 2G may be formed between epitaxial regions 330a and island regions 310b. Many of the same considerations, variations, advantage and features described above in reference to the process depicted by FIGS. 2A-2G also apply to the process depicted by FIGS. 3A-3D and thus will not be repeated.

Figure 4A:
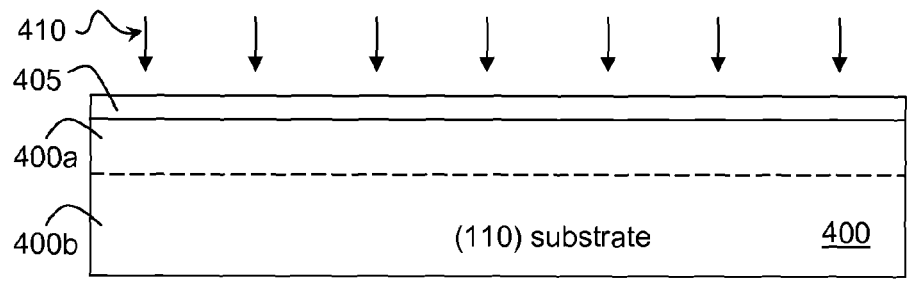
FIGS. 4A-4F are simplified cross-sectional views showing an exemplary method for forming a hybrid substrate according to yet embodiment of the present invention.

FIGS. 4A-4F are simplified cross-sectional views showing an exemplary method for forming another hybrid substrate according to yet another embodiment of the present invention. In FIG. 4A, dielectric layer 405 is formed over (110) substrate 400. An implant process 410 is used to implant hydrogen ions and/or molecules into substrate 400 to form a hydrogen-rich region at a depth (depicted by the dashed line in FIG. 4A) within substrate 400, thus dividing substrate 400 into upper portion 400a and lower portion 400b. Dielectric layer 405 may be formed of, for example, oxide, nitride, oxynitride, other dielectric material or various combinations thereof. Dielectric layer 405 may be formed by, for example, a CVD process. In some embodiments, substrate 400, upper and lower portions 400a, 400b, and implant process 410 are similar to substrate 200, upper and lower portions 200a, 200b, and implant process 210, respectively, described above in reference to FIG. 2A. In some embodiments, implant 410 is made through dielectric layer 405. Implant process 410 may require an implantation energy higher than that of implant process 210.

Figure 4B:
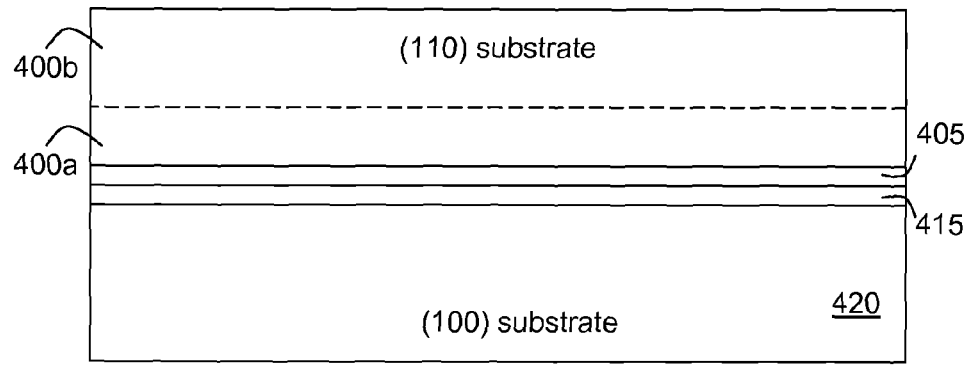

In FIG. 4B, substrate 400 with dielectric layer 405 is flipped and bonded on a dielectric layer 415 extending over a substrate 420, using known techniques. Dielectric layer 415 may comprise oxide, nitride, oxynitride, other dielectric material or various combinations thereof. Dielectric layer 415 may be formed by, for example, a CVD process. Dielectric layer 405 may be similar to dielectric layer 415. Substrate 420 may be similar to substrate 220 described above in reference to FIG. 2B.

Figure 4C:
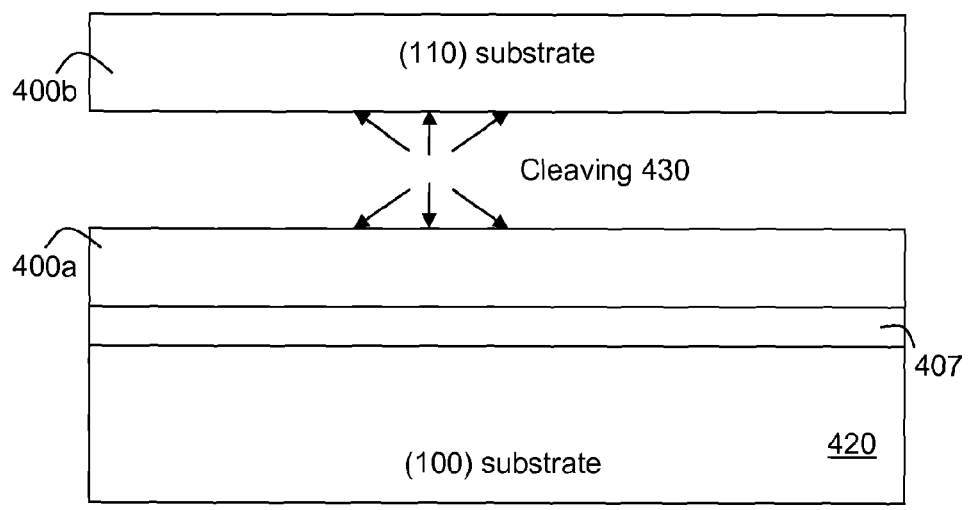

In FIG. 4C, a conventional cleaving process 430 is carried out to cleave substrate 400 along the hydrogen-rich region to thereby separate substrate portions 400a and 400b from each other. In FIG. 4C, to reduce clutter, the two dielectric layers 405 and 415 are combined and marked as dielectric layer 407. Cleaving process 430 may be similar to cleaving process 230 described above in reference to FIG. 4C.

Figure 4D:
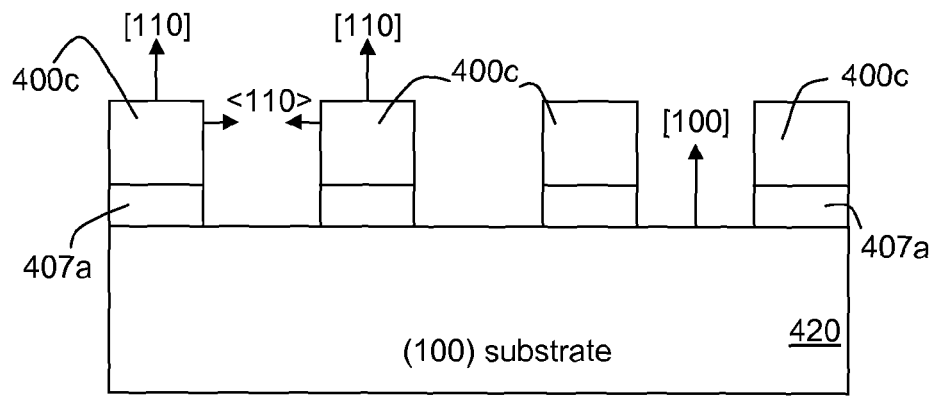

Referring to FIG. 4D, predefined portions of the (110) substrate 400b and their underlying portions of dielectric layer 407 are removed to thereby expose surface regions of substrate 420. Of substrate 400b and dielectric layer 407, islands regions 400c and their underlying dielectric regions 407a thus remain. Island regions 400c may be formed by, for example, forming a patterned photoresist layer (not shown) over substrate 400a followed by a conventional etch process to remove portions of substrate 400a exposed through the patterned photoresist layer. After forming island regions 400c, using the same patterned photoresist mask, portions of dielectric layer exposed through the patterned photoresist layer may be removed.

Figure 4E:
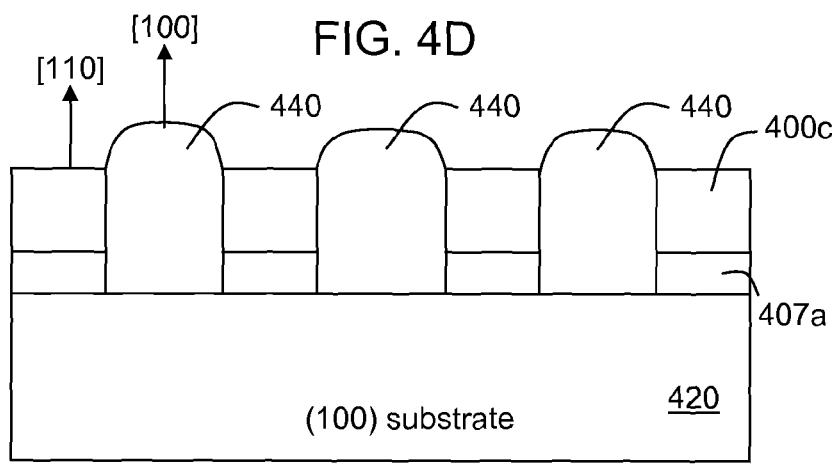

Referring to FIG. 4E, epitaxial regions 440 are selectively formed from those surfaces of the (100) substrate 420 that are exposed through island regions 400c. The process for forming epitaxial regions 440 may be similar to that for forming epitaxial regions 240 described above in reference to FIG. 2E. Many of the same considerations, variations and advantages and features described above in connection with the process step of FIG. 2E apply here, and thus will not be repeated.

Figure 4F:
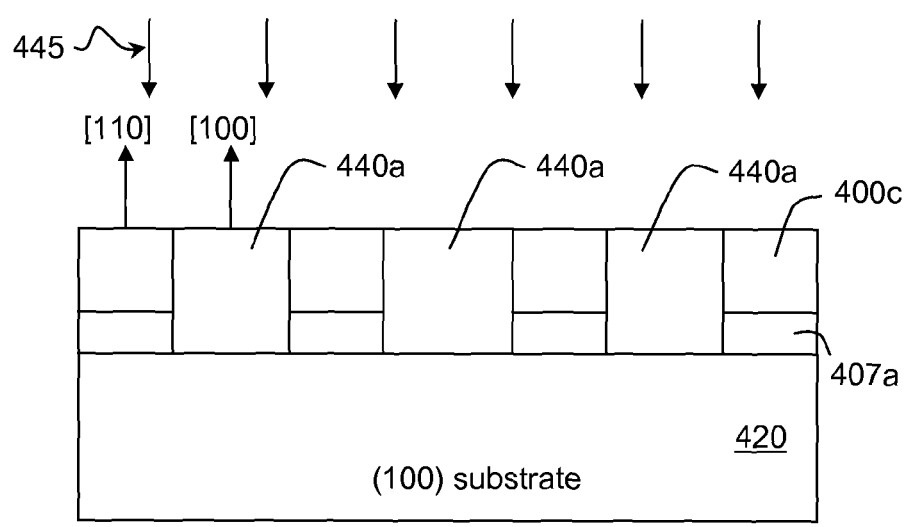

In FIG. 4F, a removing process 445 removes portions of epitaxial regions 440 so that island regions 400c and remaining portions 440a of epitaxial regions 440 are substantially coplanar. Removing process 445 may be similar to removing process 245 described above in reference to FIG. 2F. Referring again to FIG. 4F, the surfaces of the epitaxial layers 440a have the crystalline orientation [100] and the surfaces of the regions 400c have the crystalline orientation [110].

In some embodiments, isolation regions similar to isolation regions 250 in FIG. 2G may be formed between island regions 400c and epitaxial regions 440a in a similar manner.

Figure 5A:
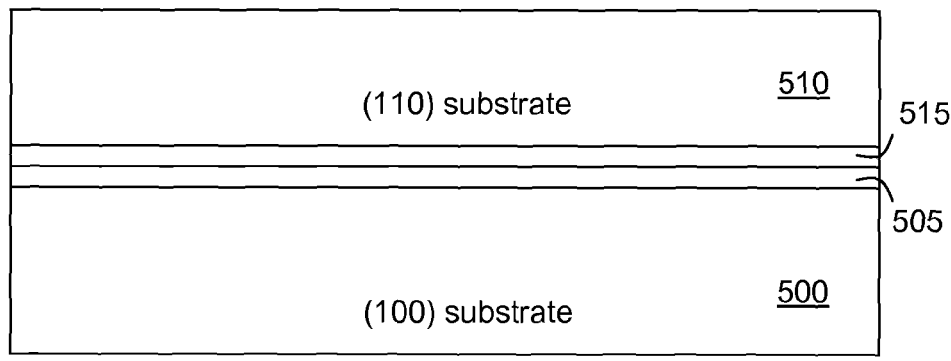
FIGS. 5A-5E are simplified cross-sectional views showing an exemplary process for forming a hybrid substrate according to still another embodiment of the present invention.

FIGS. 5A-5E are simplified cross-sectional views showing an exemplary process for forming a hybrid substrate according still another embodiment of the present invention. In FIG. 5A, (110) substrate 510 having a dielectric layer 515 is bonded with a dielectric layer 505 extending over (100) substrate 500. In some embodiments, substrates 500, 510 and dielectric layers 505, 515 are similar to substrates 400, 420 and dielectric layers 405, 415, respectively, described above in reference to FIG. 4B, except that a hydrogen-rich region is not formed in substrate 500. The process for bonding substrates 500 and 510 can be similar to that described above in reference to FIG. 4B and thus will not be described.

Figure 5B:
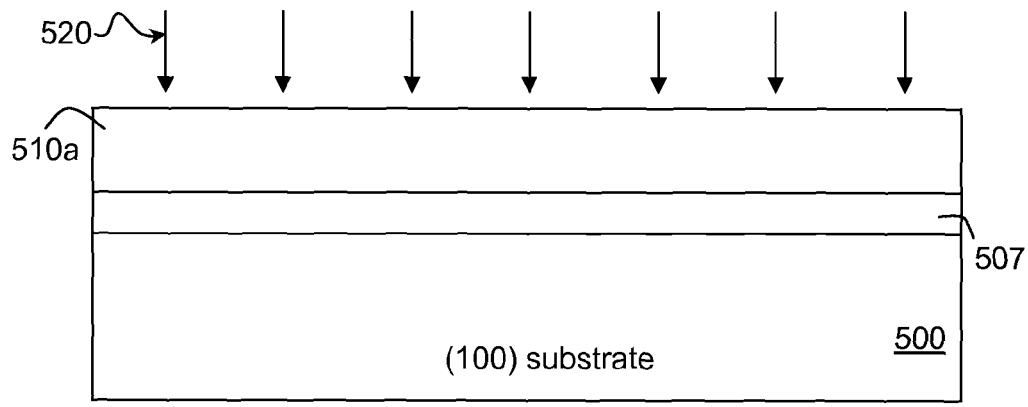

In FIG. 5B, a silicon thinning process 520 may be sued to remove a portion of the (110) substrate 510 such that a layer 510a of the (110) substrate 510 remains over dielectric layers 515 and 505. In FIG. 5B, to reduce clutter, the two dielectric layers 515 and 505 are combined and marked as dielectric layer 507. Removing process 520 may include a grinding process, a CMP process and/or an etch-back process.

Figure 5C:
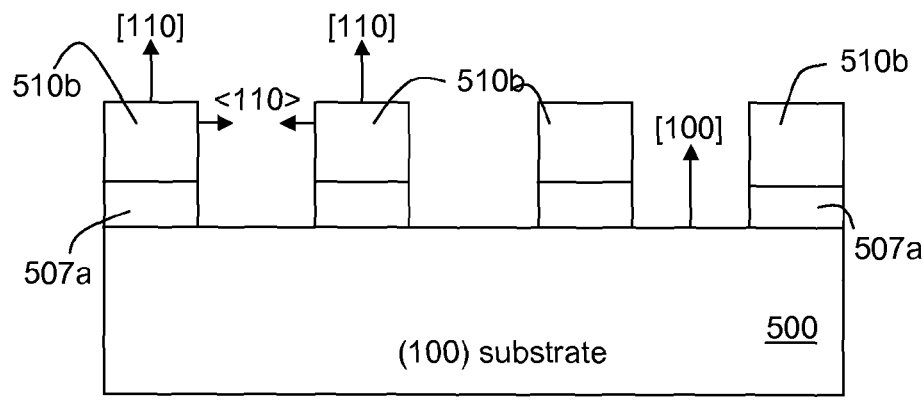

Referring to FIG. 5C, predefined portions of (110) substrate 510a and their underlying portions of dielectric layer 407 are removed to thereby expose surface regions of substrate 500. Of substrate 510a and dielectric layer 407, islands regions 510b and their underlying dielectric regions 507a thus remain. The process for forming island regions 510b and dielectric regions 507a may be similar to the process for forming island regions 400c and dielectric regions 407a described above in reference to FIG. 4D.

Figure 5D:
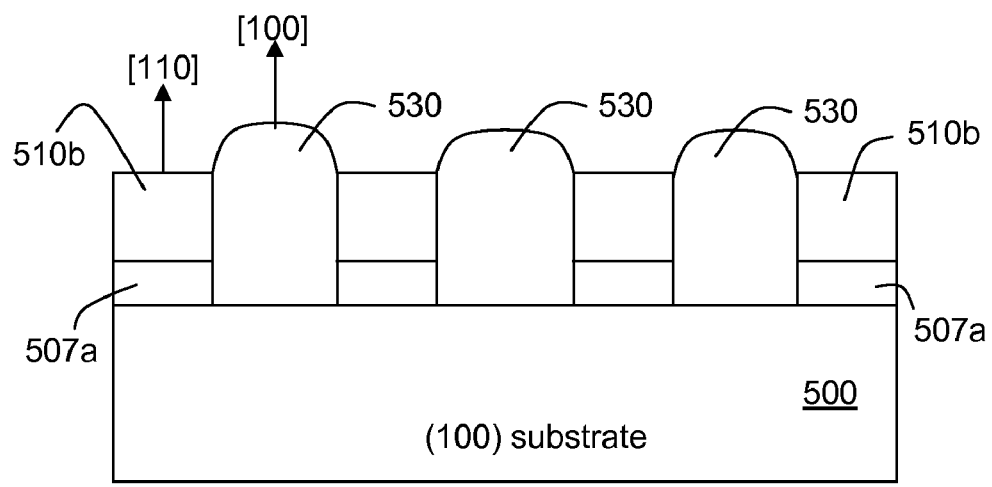

In FIG. 5D, epitaxial regions 530 are selectively formed from those surfaces of the (100) substrate 500 that are exposed through island regions 510b. The process for forming epitaxial regions 530 may be similar to that for forming epitaxial regions 240 described above in reference to FIG. 2E. Many of the same considerations, variations and advantages and features described above in connection with the process step of FIG. 2E apply here, and thus will not be repeated.

Figure 5E:
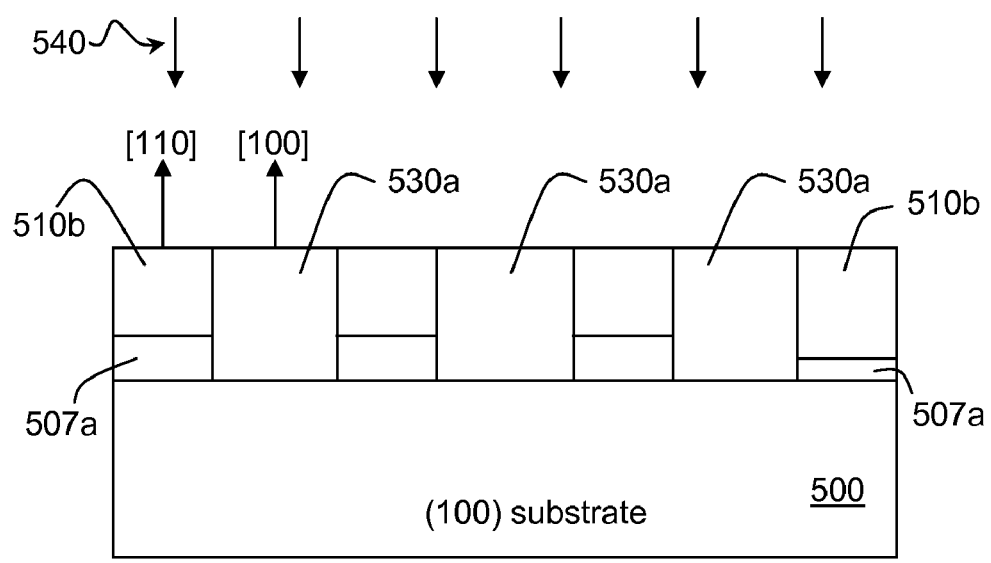

In FIG. 5E, a removing process 540 removes portions of epitaxial regions 530 so that island regions 510b and remaining portions 530a of epitaxial regions 530 are substantially coplanar. Removing process 540 may be similar to removing process 245 described above in reference to FIG. 2F, and thus will not be repeated here.

In some embodiments, isolation regions similar to isolation regions 250 in FIG. 2G may be formed between island regions 510b and epitaxial regions 530a in a similar manner.

The various hybrid substrates described above can be advantageously used in manufacturing IC's in which components (such as transistors, diodes, etc.) that operate based on electron current conduction as well as components that operate based on hole current conduction are monolithically integrated. Those components that operate based on electron current conduction can advantageously be formed in the region(s) of the hybrid substrate that have high electron mobility (e.g., in (100) regions 240a in FIGS. 2F and 2G, or in (100) regions 330a in FIG. 3E, or in (100) regions 440a in FIG. 4F, or in (100) regions 530a in FIG. 5E) and those components that operate based on hole current conduction can advantageously be formed in the region(s) of the hybrid substrate that have high hole mobility (e.g., in (110) regions 200c in FIGS. 2F and 2G, or in (110) regions 310b in FIG. 3E, or in (110) regions 400c in FIG. 4F, or in (110) regions 510b in FIG. 5E). An example of an IC where two such components can be monolithically integrated in a single substrate will be described next using the circuit schematic shown in FIG. 7.

Figure 7:
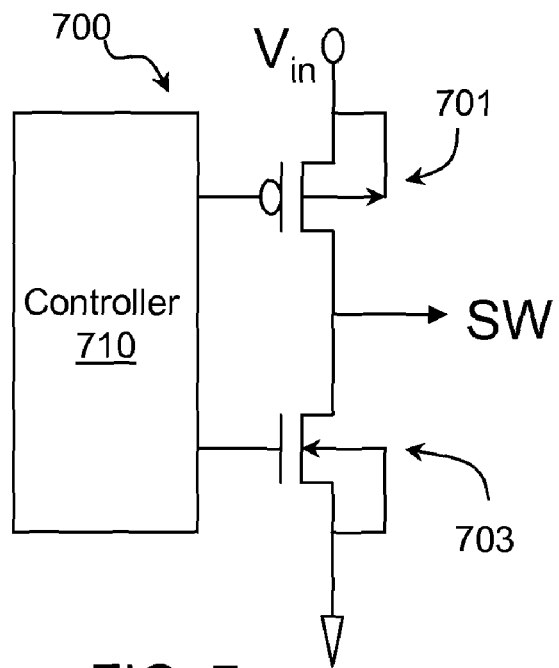
FIG. 7 is a simplified schematic circuit diagram of a DC-DC converter using a hybrid substrate formed according to any one of the embodiments of the present invention.

FIG. 7 is a simplified circuit diagram of an exemplary DC-DC buck converter. Converter 700 includes a controller 710 coupled to drive the gates of PMOS transistor 701 and NMOS transistor 703. PMOS transistor 701 may be referred to as a high-side switch and NMOS transistor 703 may be referred to as a low-side switch. Converter 700 provides a stable direct current (DC) supply when installed in battery-powered vehicles or generator sets. Conventionally, NMOS transistor 703 and PMOS transistor 701 have been formed as discrete components, in part because monolithic implementation of these two different types of transistors has been hampered by the inability to individually optimize each of the two transistors. However, the hybrid substrate embodiments and their variants described above enable integrating these two transistors on the same substrate while ensuring optimum performance of each transistor. For example, NMOS transistor 703 may be formed in (100) regions 240a of either of the substrates shown in FIGS. 2F and 2G, or in (100) regions 330a in FIG. 3E, or in (100) regions 440a in FIG. 4F, or in (100) regions 530a in FIG. 5E. NMOS transistor 703 formed in these (100) regions advantageously benefits from the high electron mobility of the (100) regions. PMOS transistor 701 may be formed in (110) regions 200c of either of the substrates shown in FIGS. 2F and 2G, or in (110) regions 310b in FIG. 3E, or in (110) regions 400c in FIG. 4F, or in (110) regions 510b in FIG. 5E. PMOS transistor 701 formed in these (110) regions advantageously benefits from the high hole mobility of the (110) regions. A DC-DC buck converter with superior performance characteristics can thus be obtained. Other types of power converters and switches in which low and/or high voltage power devices are used may be similarly implemented using any one of the hybrid substrates and their variants described above.

In power device applications where it is desirable to electrically isolate the PMOS and NMOS transistors from one another, the hybrid substrate shown in FIG. 2G with the isolation structures electrically isolating the (100) and (110) regions from one another may be used. Alternatively, where monolithic integration of PMOS and NMOS transistors on an SOI (silicon on insulator) substrate is desired, the SOI hybrid substrate in FIG. 4F or in FIG. 5E may be used.

Other technology areas where the above-described hybrid substrates may be advantageously used are standard CMOS technology and BiCMOS technology. Since conventional CMOS ICs include both NMOS and PMOS transistors on a single substrate, these transistors can be advantageously formed in corresponding (100) and (110) regions of any one of the above-described hybrid substrates, thus enabling maximizing the potential performance of the PMOS and NMOS transistors. In some CMOS IC's, it is desirable to electrically isolate the PMOS and NMOS transistors from one another. The hybrid substrate shown in FIG. 2G with the isolation structures electrically isolating the (100) and (110) regions from one another may be used for such ICs. Alternatively, where monolithic implementation of PMOS and NMOS transistors on an SOI (silicon on insulator) substrate is desired, the SOI hybrid substrate in FIG. 4F or in FIG. 5E may be used. Also, the above described hybrid substrates with the distinct regions advantageously facilitate combining CMOS and bipolar transistors on the same substrate.

In general, where monolithic integration of components (e.g., transistors, diodes, etc.) that operate based on hole current conduction and components that operate based on electron current conduction is desirable, the above-described hybrid substrates and their variants can advantageously be used to house such components in the appropriate high hole mobility regions and high electron mobility regions. As such, the invention is not limited to any particular types of devices.

Figure 8A:
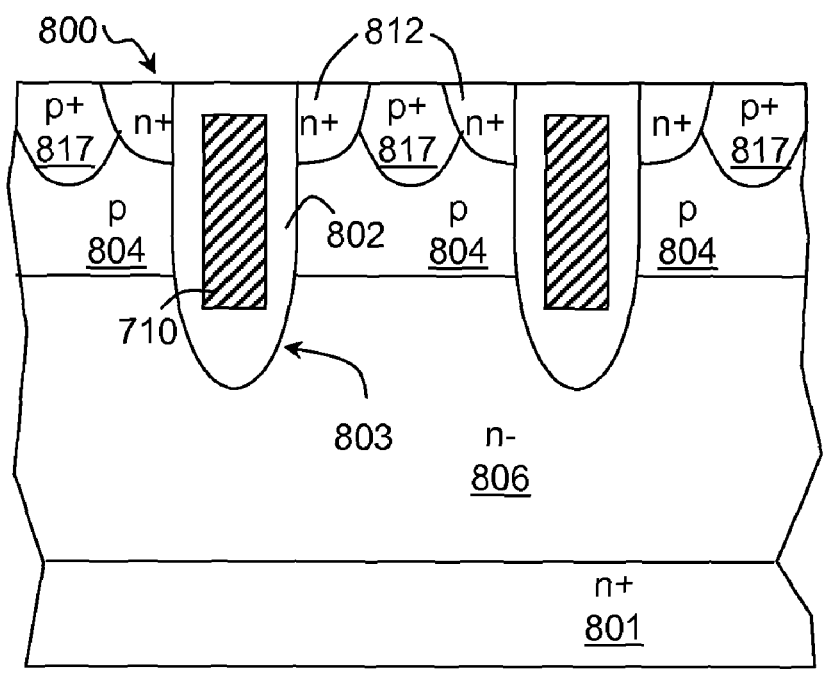
FIG. 8A is a simplified cross-sectional view of an exemplary N-type trench power MOSFET formed in a hybrid substrate according to an embodiment of the present invention.
Figure 8B:
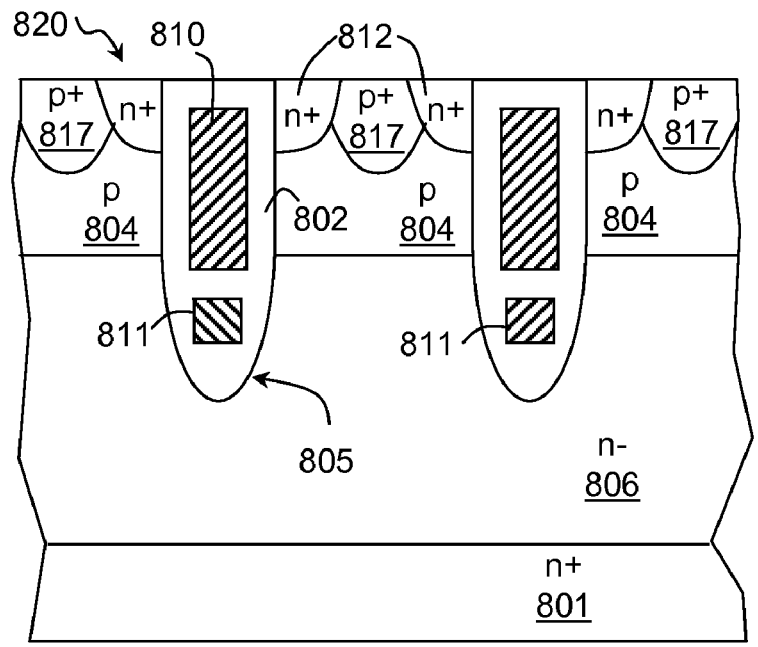
FIG. 8B is a simplified cross-sectional view of an exemplary N-type shielded gate trench power MOSFET formed in a hybrid substrate according to an embodiment of the present invention.
Figure 9:
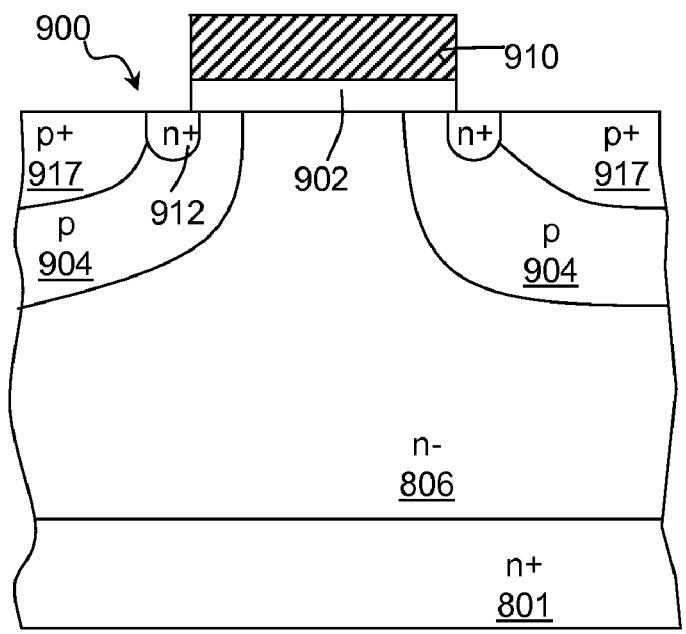
FIG. 9 is a simplified cross-sectional view of an exemplary N-type planar gate power MOSFET formed in a hybrid substrate according to an embodiment of the present invention.

FIGS. 8A, 8B, and 9 show three exemplary N-channel power MOSFETs any of which can be advantageously formed, with or without its P-channel MOSFET counterpart, in any of the above-described substrates. Each of these MOSFETs will be briefly described next.

FIG. 8A is a simplified cross-sectional view of an exemplary N-channel trench gate power MOSFET 800 that can be formed, for example, in the (100) regions of any of the above-described hybrid substrates. As with all other figures described herein, it is to be understood that the relative dimensions and sizes of various elements and components depicted in the figures do not exactly reflect actual dimensions and are for illustrative purposes only. MOSFET 800 includes an N-type epitaxial region 806 formed over an N+ substrate 801. The (100) regions in any of hybrid substrates shown in FIGS. 3E, FIG. 4F, FIG. 5E or their variants may serve as substrate 801. P-type body regions 804 may be formed in epitaxial region 806. N+ source regions 812 and P+ heavy body regions 817 are formed in body regions 804. Trenches 803 extend through body regions 804 and terminate in the drift region (i.e., the region of epitaxial layer 806 bounded by body regions 804 and substrate 801). Each trench 803 includes a gate electrode 810, a thick bottom dielectric (typically oxide) extending under gate electrode 810, gate dielectric 802 lining the trench sidewall, and a dielectric layer capping each gate electrode 810.

FIG. 8B is a simplified cross-sectional view of an exemplary N-channel shielded gate power MOSFET that similar to the FIG. 8A MOSFET can be formed, for example, in the (100) regions of any of the above-described hybrid substrate.

The MOSFET in FIG. 8B is substantially similar to the MOSFET shown in FIG. 8A except trenches 605 extend deeper into epitaxial layer 806, and each trench includes a shield electrode 811 under gate electrode 802. This shielded gate structure, as compared to the trench gate MOSFET in FIG. 8A, advantageously provides a higher Rdson for the same breakdown voltage.

In both MOSFET structures shown in FIGS. 8A and 8B, a top-side source interconnect layer (not shown) may be formed to contact source regions 812 and heavy body regions 817. Also, a back-side drain interconnect layer (not shown) may be formed to contact the backside of substrate 801.

FIG. 9 is a simplified cross-sectional view of an exemplary N-channel planar gate MOSFET that can be formed, for example, in the (100) regions of any of the above-described hybrid substrates. In FIG. 9, N-type epitaxial layer 906 is formed over N+ substrate 901. The (100) regions in any of hybrid substrates shown in FIGS. 3E, FIG. 4F, FIG. 5E or their variants may serve as substrate 801. P-type body regions 904 are formed in epitaxial layer 906. Gate insulator 902 and gate electrodes 910 laterally extend over epitaxial layer 906. N+ source regions 912 and P+ heavy body regions 917 are formed in body regions 904. A top-side source interconnect layer (not shown) may be formed to contact source regions 912 and heavy body regions 917, and a back-side drain interconnect layer (not shown) may be formed to contact the backside of substrate 801.

As indicate above, the invention is not limited to any particular types of transistors and may be used in manufacturing a variety of devices. For example, any of the above-described hybrid substrates may accommodate: p-channel MOSFETs (e.g., a transistor similar in structure to any of those in FIGS. 8A, 8B, 9 except that the conductivity type of all silicon regions is reversed); n-channel IGBTs (i.e., a transistor similar in structure to any of those in FIGS. 8A, 8B, 9 except that a p-type substrate is used instead of the n-type substrate); p-channel IGBTs (i.e., a transistor similar in structure to any of those in FIGS. 8A, 8B, 9 but with silicon regions of opposite conductivity except the substrate is kept N-type); laterally conducting power MOSFETs (i.e., a transistor similar in structure to any of those in FIGS. 8A, 8B, 9 except that the drain contact is made on the top side rather than the backside); synchronous FETs (i.e., monolithically integrated MOSFETs of the trench gate or lateral gate variety with Schottky rectifier); and superjunction variations of the any above devices (i.e., devices with columns of alternating conductivity type silicon).

Thus, while the above is a complete description of specific embodiments of the present invention, various modifications, variations, and alternatives may be employed. The scope of this invention should thus not be limited to the embodiments described herein, but are instead defined by the following claims.

What is claimed is:

1. A method for forming a hybrid substrate, comprising:
    providing first and second substrates having different crystalline orientations;
    bonding the first and second substrates together to thereby form a unitary hybrid substrate;
    removing predefined portions of the first substrate to form openings in the first substrate through which surface regions of the second substrate are exposed; and
    carrying out a selective epitaxial growth process that is selective with respect to the crystalline orientations of the first and second substrates to thereby form epitaxial silicon from the exposed surfaces of the second substrate but not from exposed surfaces of the first substrate, wherein the epitaxial silicon formed from the exposed surfaces of the second substrate has the same crystalline orientation as the second substrate;

wherein the selective epitaxial growth process comprises a chlorine-containing etchant that provides a faster etch rate of the epi along the exposed surfaces of the first substrate than the epi along the exposed surfaces of the second substrate.

2. The method of claim 1 further comprising:
prior to the bonding step, forming a hydrogen-rich region at a predetermined depth within the first substrate; and
after the bonding step, performing a cleaving process to separate the first substrate into two portions along the hydrogen-rich region.

3. The method of claim 1, wherein prior to the removing step the first substrate is thinned down to a desired thickness.

4. The method of claim 1 further comprising:
forming first and second transistors in the epitaxial silicon and the second substrate, respectively, the first transistor being capable of operating based on hole current conduction, and the second transistor being capable of operating based on electron current conductions.

5. The method of claim 1 further comprising:
performing a silicon removal process so that a top surface of the second substrate and a top surface of the epitaxial silicon become substantially coplanar.

6. The method of claim 1, wherein the grown epitaxial silicon directly contacts sidewalls of the openings in the first substrate.

7. The method of claim 1 further comprising:
prior to forming the epitaxial silicon, forming dielectric spacers along sidewalls of the openings in the first substrate so that after the epitaxial silicon is formed, the dielectric spacers insulate the epitaxial silicon from the first substrate.

8. The method of claim 1, wherein the selective epitaxial growth process provides a faster growth rate along the exposed surfaces of the second substrate than along the exposed surfaces of the first substrate.

9. The method of claim 1, further comprising forming a P-channel trench gate power MOSFET in the first substrate and an N-channel trench gate power MOSFET in the epitaxial silicon formed by the selective epitaxial growth process over the second substrate.

10. The method of claim 1, further comprising forming a P-channel shielded gate power MOSFET in the first substrate and an N-channel shielded gate power MOSFET in the epitaxial silicon formed by the selective epitaxial growth process over the second substrate.

11. A method for forming a hybrid substrate, comprising:
providing first and second substrates having different crystalline orientations;
bonding the first and second substrates together to thereby form a unitary hybrid substrate;
removing predefined portions of the first substrate to form openings in the first substrate through which surface regions of the second substrate are exposed; and
carrying out a selective epitaxial growth process that is selective with respect to the crystalline orientations of the first and second substrates to thereby form epitaxial silicon from the exposed surfaces of the second substrate but not from exposed surfaces of the first substrate, wherein the epitaxial silicon formed from the exposed surfaces of the second substrate has the same crystalline orientation as the second substrate; and
forming a DC-DC converter having a PMOS transistor formed in the first substrate and an NMOS transistor formed in the epitaxial silicon formed by the selective epitaxial growth process over the second substrate.

12. The method of claim 11 further comprising:
providing a first substrate having a first dielectric layer extending over a surface of the first substrate, and a second substrate having a second dielectric layer extending over a surface of the second substrate, wherein the first and second dielectric layers together form the dielectric layer.

13. The method of claim 11 further comprising:
prior to the bonding step, forming a hydrogen-rich region at a predetermined depth within the first substrate; and
after the bonding step, performing a cleaving process to separate the first substrate into two portions along the hydrogen-rich region.

14. The method of claim 11, wherein prior to the removing step the first substrate is thinned down to a desired thickness.

15. The method of claim 11 further comprising:
forming first and second transistors in the epitaxial silicon and the second substrate, respectively, the first transistor being capable of operating based on hole current conduction, and the second transistor being capable of operating based on electron current conductions.

16. The method of claim 11 further comprising:
performing a silicon removal process so that a top surface of the second substrate and a top surface of the epitaxial silicon are substantially coplanar.

17. The method of claim 11, wherein the grown epitaxial silicon directly contacts sidewalls of the openings in the first substrate.

18. The method of claim 11 further comprising:
prior to forming the epitaxial silicon, forming dielectric spacers along sidewalls of the openings in the first substrate and the first and second dielectric layers so that after the epitaxial silicon is formed, the dielectric spacers insulate the epitaxial silicon from the first substrate.

* * * * *